(12) United States Patent
Chisaka et al.

(10) Patent No.: US 7,053,531 B2
(45) Date of Patent: May 30, 2006

(54) COMPOSITE PIEZOELECTRIC VIBRATOR (75) Inventors: Makoto Chisaka, Osaka (JP); Osamu Kobayashi, Osaka (JP)

(73) Assignee: Tayca Corporation, Osaka (JP)

( * ) Notice: Subject to any disclaimer, the term of this patent is extended or adjusted under 35 U.S.C. 154(b) by 0 days.

(21) Appl. No.: 10/512,560

(22) PCT Filed: Apr. 11, 2003

(86) PCT No.: PCT/JP03/04697

§ 371 (c)(1),
(2), (4) Date: Oct. 25, 2004

(87) PCT Pub. No.: WO03/092325

PCT Pub. Date: Nov. 6, 2003

(65) Prior Publication Data
US 2005/0174017 A1  Aug. 11, 2005

(30) Foreign Application Priority Data
Apr. 26, 2002  (JP) .............................. 2002-126409

(51) Int. Cl.
*H01L 41/08* (2006.01)
*H01I 41/24* (2006.01)

(52) U.S. Cl. ...................... 310/334; 310/358; 310/311; 29/25.35; 204/192.18

(58) Field of Classification Search ................ 310/311, 310/358, 334; 29/25.35; 204/192.18
See application file for complete search history.

(56) References Cited
U.S. PATENT DOCUMENTS
4,422,003 A * 12/1983 Safari et al. ................. 310/358
(Continued)

FOREIGN PATENT DOCUMENTS
JP          56-103598           8/1981
(Continued)

*Primary Examiner*—Darren Schuberg
*Assistant Examiner*—J. Aguirrechea
(74) *Attorney, Agent, or Firm*—Westerman, Hattori, Daniels & Adrian, LLP (57) ABSTRACT

The present invention provides a composite piezoelectric transducer having a piezoelectric ceramic, an organic polymer, and an electrode group formed only on surfaces of the piezoelectric ceramic. The groove is formed, having a depth 50% to 90% of the thickness of the piezoelectric ceramic. A ratio, between a width of a non-diced area formed by forming the groove on the piezoelectric ceramic and the depth of the groove is 0.2 to 0.7. An organic polymer is filled in the groove formed in the piezoelectric ceramic in a state including bubbles. The electrode group comprises a first electrode and a second electrode, the first electrode being formed on a first surface of the piezoelectric ceramic, and the second electrode being formed on a second surface of the piezoelectric ceramic, a side surface thereof, or on the second surface, the side surface and the first surface, the second surface being opposite to the first surface in the direction of the thickness of the piezoelectric ceramic. Thus, it has a high coefficient of electromechanical coupling (kt) in the direction of the thickness, and a reduced acoustic impedance, and preferably used especially in an ultrasonic cleaning equipment.

3 Claims, 5 Drawing Sheets

U.S. PATENT DOCUMENTS

| | | | |
|---|---|---|---|
| 5,334,903 A * | 8/1994 | Smith | 310/358 |
| 5,552,004 A * | 9/1996 | Lorraine et al. | 156/154 |
| 5,658,706 A * | 8/1997 | Niki et al. | 430/270.1 |
| 5,886,454 A * | 3/1999 | Ito et al. | 310/322 |
| 6,044,533 A * | 4/2000 | Bureau et al. | 29/25.35 |
| 6,111,818 A * | 8/2000 | Bowen et al. | 367/140 |
| 6,183,578 B1 * | 2/2001 | Ritter et al. | 156/89.12 |
| 6,300,708 B1 * | 10/2001 | Itasaka | 310/367 |
| 6,307,302 B1 * | 10/2001 | Toda | 310/334 |
| 6,919,668 B1 * | 7/2005 | Nagahara et al. | 310/358 |
| 2003/0127949 A1 * | 7/2003 | Nagahara et al. | 310/334 |
| 2004/0227429 A1 * | 11/2004 | Yin et al. | 310/311 |

FOREIGN PATENT DOCUMENTS

| | | | |
|---|---|---|---|
| JP | 2-57099 | | 2/1990 |
| JP | 5-228142 | | 9/1993 |
| JP | 2001025094 A | * | 1/2001 |
| JP | 2003309297 A | * | 10/2003 |
| WO | WO 03/092325 A1 | * | 11/2003 |

* cited by examiner

Production Chart for
the Composite Piezoelectric Transducer
of the Present Invention

Fig. 7

Prior Art

FIG. 8

COMPOSITE PIEZOELECTRIC VIBRATOR

FIELD OF THE INVENTION

The present invention relates to a composite piezoelectric transducer, which utilizes vibration in the thickness direction of the piezoelectric transducer (longitudinal vibration), and in more detail, the present invention relates to a composite piezoelectric transducer, which is suitable for an ultrasonic cleaning equipment.

BACKGROUND OF THE INVENTION

Conventionally, an ultrasonic cleaning equipment using a piezoelectric transducer comprises at least one sheet of a ceramic piezoelectric transducer, shaped in a plate having a rectangular top surface, which is attached to a cleaning bath to generate an ultrasonic wave by the action of resonant frequency or antiresonant frequency in the longitudinal direction.

However, the sound pressure generated by the conventional piezoelectric transducer is concentrated at the center thereof, thus getting lower at the end thereof. Therefore, a cleaning bath, having a plurality of the piezoelectric transducer sheets attached, may cause an uneven washing, because the joint portions of the piezoelectric transducer generate a lowered sound pressure. Therefore, one approach has been made to increase the size of the sheet of the piezoelectric transducer, which however results in raising the cost of the production.

Another approach has been made to use a low gravity glass or an acrylic resin as the material for the cleaning bath, in order to increase the energy efficiency. However, there is a difference in gravity between the piezoelectric transducer and the material such as the glass and acrylic resin, resulting in inefficient transmittance of the sound wave. Thus, it has been demanded to provide a piezoelectric transducer having a low gravity.

Further, in case of a conventional piezoelectric transducer, a vibration mode in the lateral direction interferes with the vibration mode in the thickness direction, resulting in reducing a generation force for the ultrasonic wave in the thickness direction, to the extent that a coefficient of electromechanical coupling (kt) in the thickness direction decreases into 50% or less.

Then, a composite piezoelectric transducer has been proposed to integrate a piezoelectric ceramic with an organic polymer. Such a composite piezoelectric transducer is known to give a high coefficient of the electromechanical coupling (kt), and a reduced acoustic impedance, thereby increasing a propagation efficiency of the ultrasonic wave in a solvent. However, a conventional method, such as dice and fill method, for producing the composite piezoelectric transducer is disadvantage in cost. According to the conventional method, a sintered ceramic is subjected to a surface treatment, followed by forming grooves on the ceramic by using a dicing saw, into which an organic polymer is filled and set (cured). After removing an organic polymer such as protruded by the setting, the thickness is adjusted by polishing (grinding) by means of a wrap grinder, and then, a masking is applied for forming electrodes. After forming the electrodes, the masking is removed, and subjected to a polarization treatment. Namely, the conventional method accompanies complicated processes, and is not practical in view of high costs.

The present invention is accomplished for the purpose to solve such objectives, providing a composite piezoelectric transducer having no difference in sound pressure between the center and the end portion of the piezoelectric transducer, resulting in showing an even distribution of the sound wave. The composite piezoelectric transducer of the present invention also has a high coefficient of electromechanical coupling (kt), and a reduced acoustic impedance, thereby improving a propagation efficiency of the ultrasonic wave.

The objectives of the present invention are accomplished by a composite piezoelectric transducer comprising a piezoelectric ceramic, an organic polymer, and an electrode group formed only on surfaces of the piezoelectric ceramic. The organic polymer is filled in a groove formed in the piezoelectric ceramic in a state including bubbles. The electrode group comprises a first electrode and a second electrode. The first electrode is formed on a first surface of the piezoelectric ceramic, the first surface having a margin portion. The second electrode is formed on a second surface of the piezoelectric ceramic and a side surface thereof, or on the second surface, the side surface and the first surface, the second surface being opposite to the first surface in the direction of the thickness of the piezoelectric ceramic, and the first electrode being insulated from the second electrode by the margin. The groove of the piezoelectric ceramic is formed to extend from the second surface, forming the second electrode of the piezoelectric ceramic, toward the first surface forming the first electrode, and extending in the direction perpendicular to the side surface. The groove has a depth 50% to 90% of the thickness of the piezoelectric ceramic. A ratio, between a width of a non-diced area formed by forming the groove on the piezoelectric ceramic and the depth of the groove, (that is a ratio between the width of the non-diced area and the depth of the groove, of the piezoelectric ceramic) is 0.2 to 0.7.

BRIEF DESCRIPTION OF THE DRAWINGS

FIG. 1(Y) shows a view as seen from a first surface, and FIG. 1(Z) shows a view as seen from a second surface opposite to the first surface.

DETAILED DESCRIPTION OF THE INVENTION

The present invention is hereinafter described in detail based on a best mode.

Figure 1:
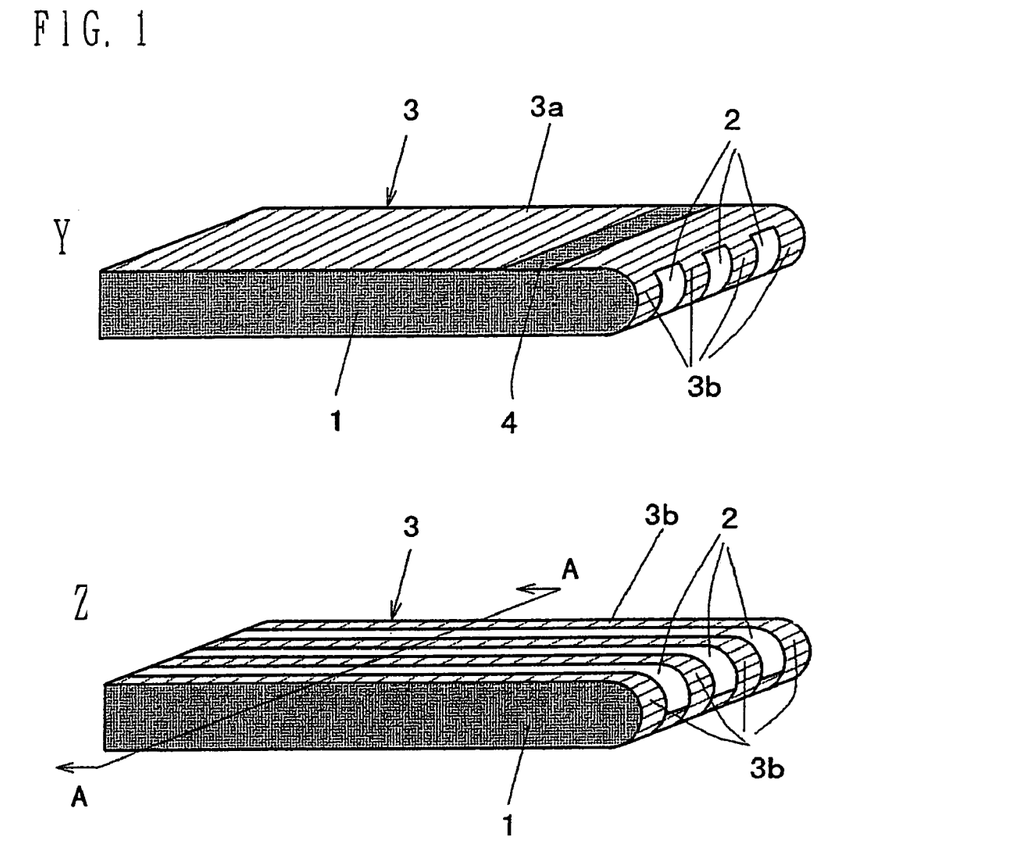
FIG. 1 shows a perspective view illustrating an embodiment of the composite piezoelectric transducer of the present invention, and in particular.
Figure 2:
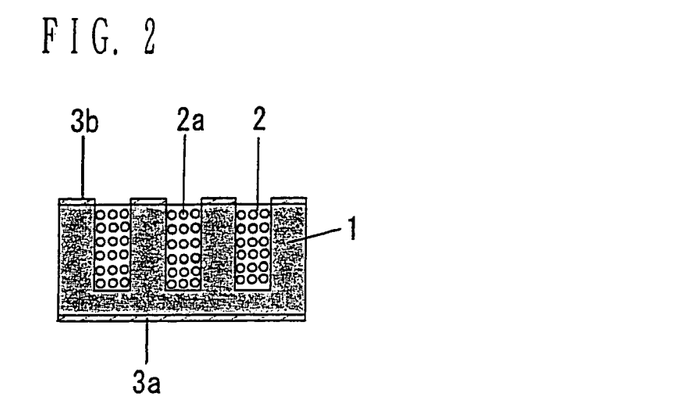
FIG. 2 shows an enlarged cross-sectional view illustrating the cross section A—A shown in FIG. 1(Z).
Figure 3:
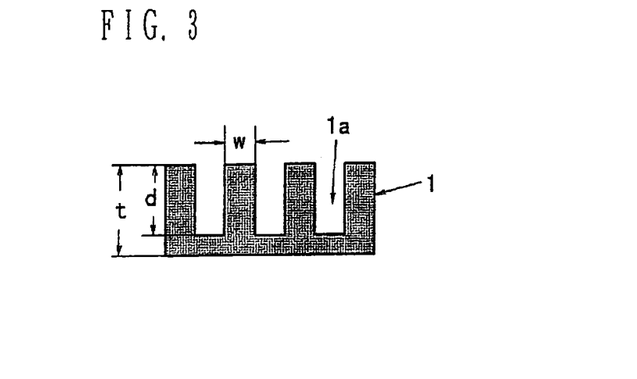
FIG. 3 shows a cross-sectional view illustrating only a portion of the piezoelectric ceramic of the composite piezoelectric transducer shown in FIG. 2, which is also shown in FIG. 1.

FIG. 1 shows a perspective view illustrating an embodiment of the composite piezoelectric transducer of the present invention. FIG. 1(Y) shows a view from one surface, that is, from a first surface which forms positive and negative electrodes, and FIG. 1(Z) shows a view as seen from another surface opposite to the one surface, that is, from a second surface opposite to the first surface as shown in FIG. 1(Y). FIG. 2 shows an enlarged cross-sectional view illustrating the cross section A—A shown in FIG. 1(Z). FIG. 3 shows a cross-sectional view illustrating only a portion of the piezoelectric ceramic of the composite piezoelectric transducer shown in FIG. 2, which is shown in FIG. 1.

Figure 5:
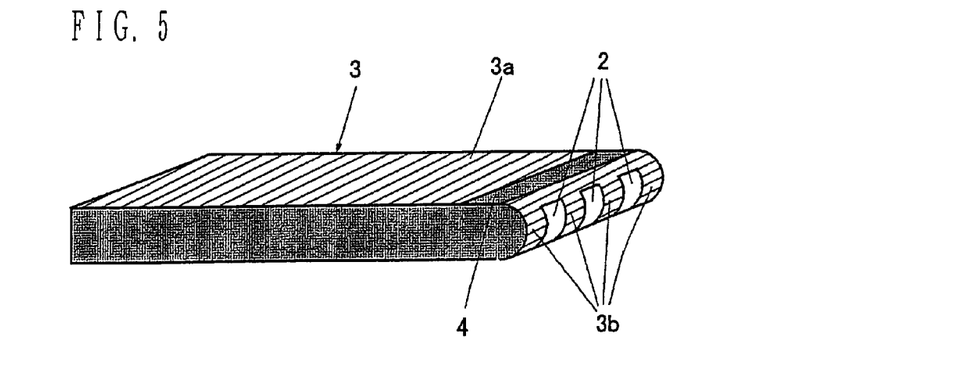
FIG. 5 shows a perspective view illustrating another embodiment of the composite piezoelectric transducer of the present invention, as seen from the side having a first electrode formed.

A composite piezoelectric transducer as shown FIG. 1 comprises a piezoelectric ceramic 1, an organic polymer 2, and an electrode group 3 formed only on the surfaces of the piezoelectric ceramic 1. The organic polymer 2 includes bubbles 2a, as shown in FIG. 2. The bubble 2a occupies almost all the volume of the organic polymer, shown by the symbol 2. The electrode group 3 comprises a first electrode 3a and a second electrode 3b. The first electrode 3a is formed on a first surface of the piezoelectric ceramic 1. The first surface has a margin portion 4 formed. In case of the composite piezoelectric transducer as shown FIG. 1, the second electrode 3b is formed on a second surface, which is extended to be formed on one of the side surfaces, and the first surface of the piezoelectric ceramic 1. The first electrode 3a is insulated from the second electrode 3b by the margin portion 4. Thus, in case of the composite piezoelectric transducer as shown FIG. 1, positive and negative electrodes can be formed on a single surface of the composite piezoelectric transducer (that is, a surface having a first electrode 3a and a margin portion 4 formed, as shown in FIG. 1(Y), in case of the composite piezoelectric transducer as shown FIG. 1). It is noted that apparent from the explanation above, the electrode group 3, that is, the first electrode 3a and the second electrode 3b, are formed only on the surface of the piezoelectric ceramic 1, and not formed on the surface of the organic polymer 2. Instead of the embodiment as shown in FIG. 1, a second electrode 3b can be formed only on the second surface, which is extended to be formed on one of the side surfaces, as shown in FIG. 5. In this case, positive and negative electrodes can be formed on a first surface and a side surface, the first surface having a first electrode 3a formed, and the side surface having a second electrode 3b formed.

Next, the explanation is focused on the grooves formed on the piezoelectric ceramic having electrode group 3, that is, the first electrode 3a and the second electrode 3b, referring to FIG. 3. FIG. 3 shows a cross-sectional view of the piezoelectric ceramic 1, corresponding to the cross-sectional view of the composite piezoelectric transducer shown in FIG. 2. The piezoelectric ceramic 1 has grooves 1a formed in the direction of the thickness, and into the grooves, an organic polymer 2 in a state including bubbles 2a is filled. As explained above, each of the grooves 1a has a depth 50% to 90%, and in particular, 70% to 90% of the thickness "t" of the piezoelectric ceramic 1. Also, a ratio between a width "w" of a non-diced area (protrusion) and depth "d" of the groove 1a, the non-diced area being formed by forming the grooves 1a on the piezoelectric ceramic 1 (noting that the ratio is between the width "w" of the non-diced area and the depth "d" of the groove, of the piezoelectric ceramic 1) is 0.2 to 0.7, and in particular, 0.3 to 0.6. It is noted that in the present invention, the piezoelectric ceramic 1 is directed to the state not forming the first electrode 3a and the second electrode 3b, so that the thickness "t" of the piezoelectric ceramic 1 and the dept "d" of the groove 1a formed on the piezoelectric ceramic 1 excludes a thickness of the first electrode 3a and the second electrode 3b. Apparent from e.g., FIG. 1(Z) (note: that the grooves are filled with the organic polymer 2 in FIG. 1(Z)), the grooves 1a formed on the piezoelectric ceramic 1 are formed to extend from the second surface, having the formed second electrode 3b of the piezoelectric ceramic 1, toward the first surface having the formed first electrode 3a, and extending in the direction perpendicular to the side surface of the piezoelectric ceramic 1, the side surface having the second electrode 3b formed. The embodiment shown in FIG. 3 has three lines of the grooves, but the number of the grooves 1a may be 4 or more, or one.

Next, the electrode group 3 is described. The electrode group 3 comprises, as explained above, a first electrode 3a formed on a first surface of the piezoelectric ceramic 1, and a second electrode 3b, majority of which is formed on the second surface, that is opposite to the first surface in the thickness direction of the piezoelectric ceramic 1.

Figure 4:
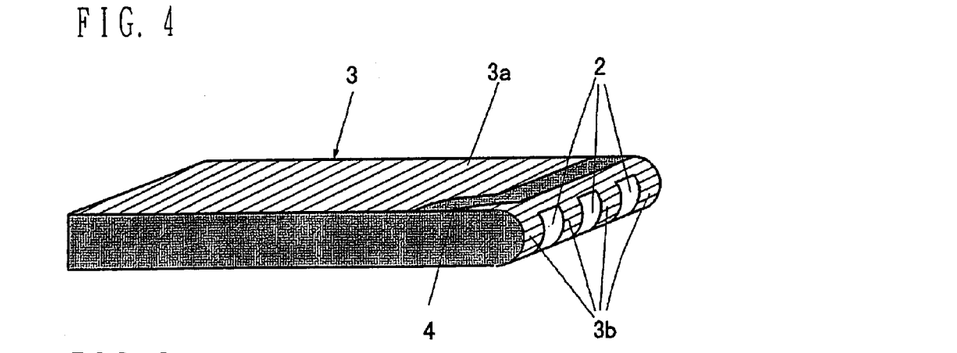
FIG. 4 shows a perspective view illustrating another embodiment of the composite piezoelectric transducer of the present invention, as seen from the side having a first electrode formed.

On the surface as seen in FIG. 1(Y), the piezoelectric ceramic 1 remains entirely. The first electrode 3a is formed on the surface at a larger area, and the second electrode 3b is partially formed, interposed by the margin portion 4. The margin portion 4 is an area not having formed electrodes (that is, a portion exposing the piezoelectric ceramic 1). Thus, the first electrode 3a is insulated from the second electrode 3b by the margin portion 4, and the first electrode 3a can be heteropolar to the second electrode 3b. Although described that the piezoelectric ceramic 1 entirely remains on the surface as seen in FIG. 1(Y), the electrode group including the first electrode 3a and the second electrode 3b are formed on the piezoelectric ceramic 1. Thus, only the margin portion 4 is in fact exposed. In addition to the margin portion 4 shaped in a line as shown in FIG. 1(Y), it is noted that a margin portion 4 can be formed to have a non-linier shape, which is partially bent as shown in FIG. 4.

Also, on the surface seen in FIG. 1(Z), the organic polymer 2 is filled in the grooves of the piezoelectric ceramic 1, so that the piezoelectric ceramic 1 and the organic polymer 2 are positioned alternately, having the second electrode 3b formed only on the piezoelectric ceramic 1. It is noted that a part of the second electrode 3b is formed also on one of the side surfaces, which is extended to be formed on a part of the first surface, thus crossing the side surface of the piezoelectric ceramic 1, separated from the first electrode 3a by the margin portion 4. The side surface, having the second electrode formed, is preferably to be applied to an R-surface process or a C-surface process, in order to avoid the discontinuity of the electrode at the edges of the piezoelectric ceramic 1.

Alternatively, the composite piezoelectric transducer of the present invention may be designed to have the second electrode 3b, formed only on the side surface, which is extended to be formed on the second surface, thus not crossing the side surface of the piezoelectric ceramic 1, as shown in FIG. 5. In the case, positive and negative electrodes can be formed on a first surface and a side surface, the first surface having the first electrode 3a formed on the piezoelectric ceramic 1 and the side surface having a part of the second electrode 3b formed.

The composite piezoelectric transducer of the present invention, though the preparation method are hereinafter explained below, is prepared by forming electrodes on a ceramic, followed by being integrated with an organic polymer. Thus, a heating process can be applicable. While a heating process such as screen printing before baking is not applicable in a conventional method in which an organic polymer is integrated and then the electrodes is formed, the present invention can be applicable.

In the present invention, the piezoelectric ceramic 1 is one to show a piezoelectric property by subjecting it to a polarization process, after forming a first electrode 3a and a second electrode 3b on the ceramic 1. The ceramic preferably includes a lead zirconate titanate ceramic (which is hereinafter referred to as "PZT ceramic materials"), a lead titanate ceramic, and a lead niobate ceramic, because of having a relatively high coefficient of the electromechanical coupling (kt).

In the present invention, it is necessary that the groove 1a formed on the piezoelectric ceramic 1 has a depth "d" 50% to 90% of the thickness "t" of the piezoelectric ceramic 1. If the depth "d" of the groove 1a is less than 50% of the thickness "t" of the piezoelectric ceramic 1, the coefficient of the electromechanical coupling (kt) is not increased in the direction of the thickness, so that a large sound pressure cannot be obtained. On the other hand, if the depth "d" of the groove 1a is more than 90% of the thickness "t" of the piezoelectric ceramic 1, the piezoelectric ceramic 1 has a reduced strength, troubling in forming the grooves 1a. Also, it is more preferable that the grooves 1a are formed on the piezoelectric ceramic 1 to have a depth "d" 70% or more of the thickness "t" of the piezoelectric ceramic 1. Where the depth "d" of the grooves 1a is formed to be 70% or more of the thickness "t" of the piezoelectric ceramic 1, it becomes more preferable because the coefficient of the electromechanical coupling (kt) is further increased, significantly reducing a spurious movement (side resonance) in the frequency impedance characteristic wave.

In the composite piezoelectric transducer of the present invention, it is necessary that a ratio, between a width "w" of a non-diced area (protrusion) formed by forming the grooves on the piezoelectric ceramic 1 and the depth "d" of the groove 1a, (that is a ratio between the width "w" of the non-diced area and the depth "d" of the groove 1a, of the piezoelectric ceramic 1) is 0.2 to 0.7. If the ratio is more than 0.7, the coefficient of electromechanical coupling (kt) does not become high. On the other hand, the ratio is less than 0.2, it is considered meaningless because the grooves 1a are difficult to be formed, and in addition, the improvement of the coefficient of the electromechanical coupling (kt) is saturated. It is preferable that the ratio, between a width "w" of a non-diced area formed by forming the groove on the piezoelectric ceramic 1 and the depth "d" of the groove 1a, is 0.3 to 0.6.

The organic polymer, which can be used in the composite piezoelectric transducer of the present invention, includes a room temperature curable type or a heat-curable type, such as an epoxy resin, a silicone resin and an urethane resin. In the present invention, the organic polymer includes bubbles, because the inclusion of the bubbles reduces a volume expansion at the time of setting the organic polymer, thereby resulting in avoiding the piezoelectric ceramic 1 from being cracked due to the volume expansion at the time of setting the organic polymer during producing the composite piezoelectric transducer.

Upon including the bubbles in the organic polymer, it is preferable to use a commercially available plastic micro balloon, which is homogeneously dispersed in a liquid or powder of an organic polymer. Thereby, when heated for the purpose to set the organic polymer, the plastic micro balloon is expanded to obtain a state of dispersing bubbles in the set organic polymer.

Also, by dispersing the bubbles in the organic polymer as explained above, the gravity of the organic polymer is reduced, decreasing the vibration inhibition in the piezoelectric transducer. Also, they reduce the gravity of the composite piezoelectric transducer, resulting in reducing the acoustic impedance and strengthening the sound wave transmitting in a solvent.

Next, a preparation method of the composite piezoelectric transducer of the present invention is hereinafter described, compared with a conventional method of the conventional composite piezoelectric transducer.

Figure 6:
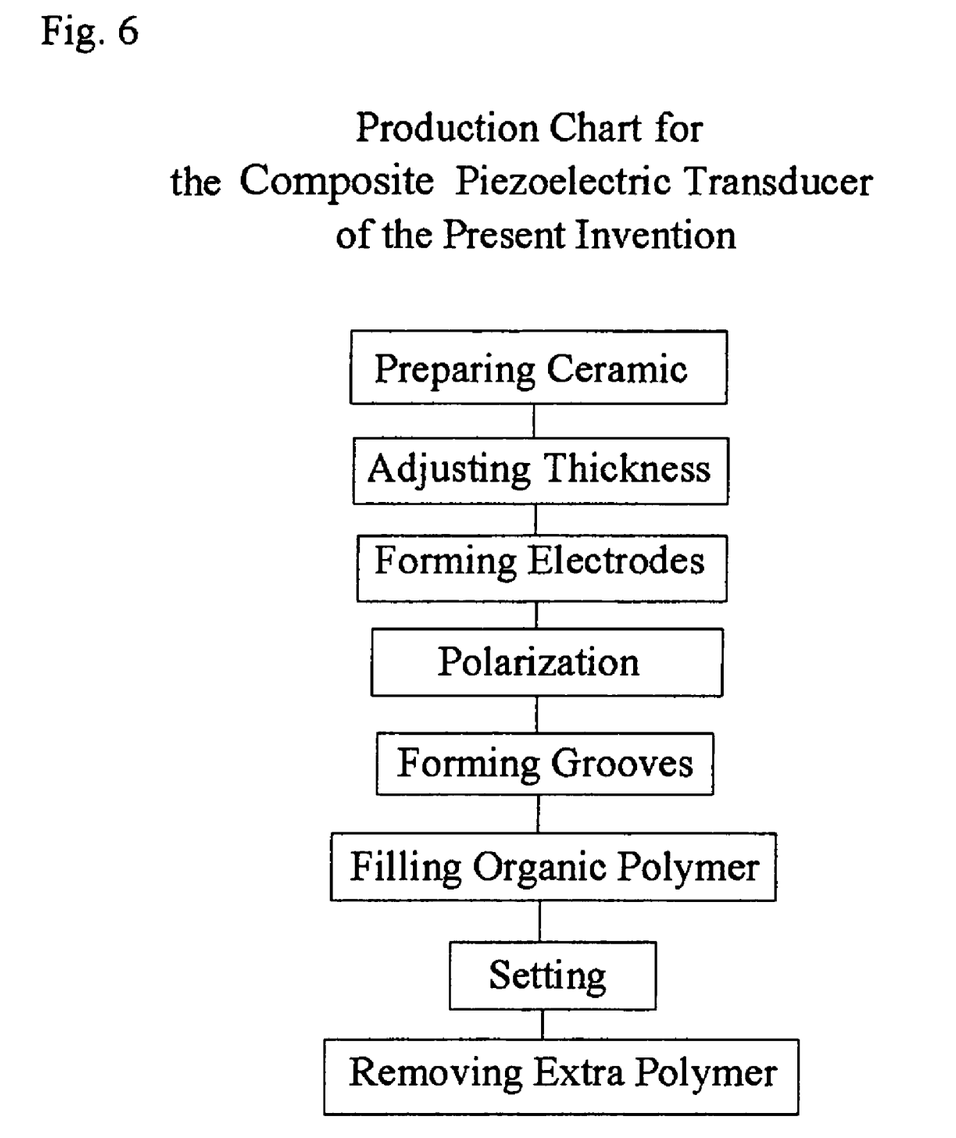
FIG. 6 shows a process chart for producing the composite piezoelectric transducer of the present invention.

The composite piezoelectric transducer of the present invention, as illustrated in FIG. 6, is produced as followed: First, a ceramic is prepared, and then, the thickness of the ceramic is adjusted, on which electrodes are formed, followed by subjected to a polarization treatment, to form a piezoelectric ceramic having electrode groups. Then, grooves are formed, into which an organic polymer is filled and set, to integrate the piezoelectric ceramic, having electrode groups, with the organic polymer including bubbles. If necessary, an excess organic polymer can be removed.

Figure 7:
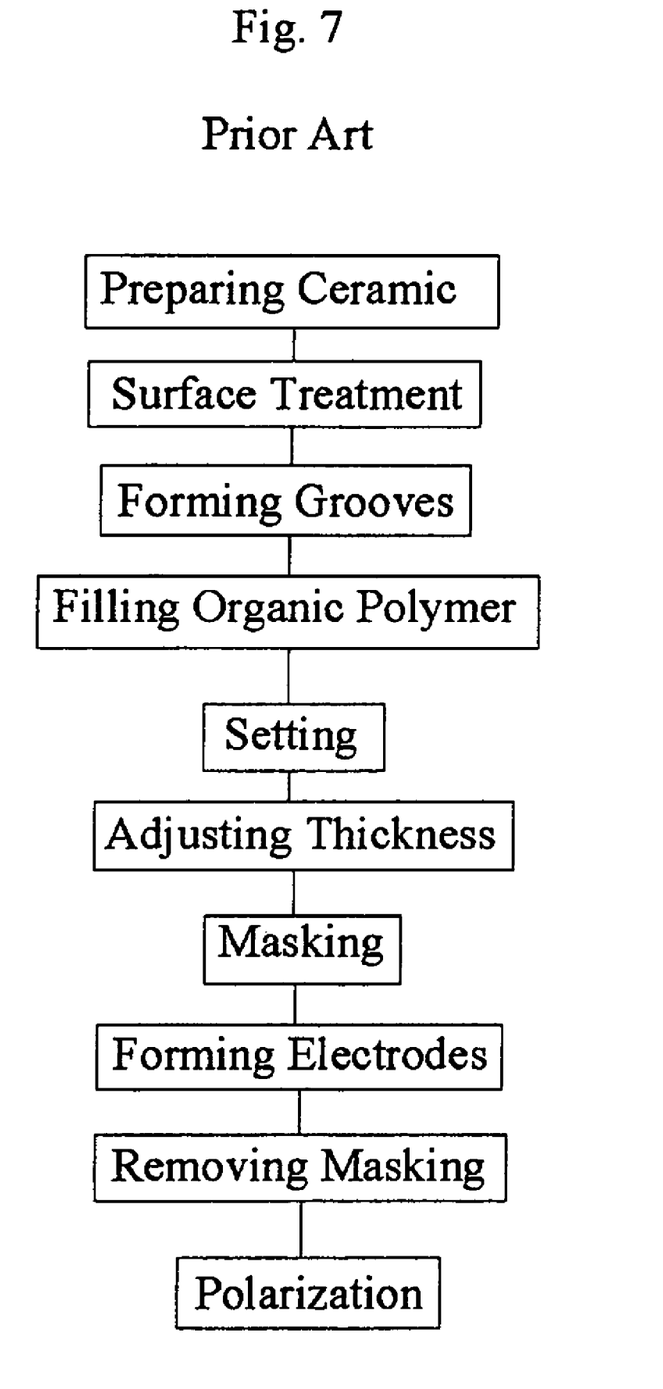
FIG. 7 shows a process chart for producing the composite piezoelectric transducer of the prior art.

On the contrary, the conventional composite piezoelectric transducer, as illustrated in FIG. 7, is produced as followed: First, a ceramic is prepared, and the surface of the prepared ceramic is adjusted, on which grooves are formed. Into the grooves, an organic polymer is filled and set, followed by adjusting the thickness. Then, a masking is applied thereon, to form electrodes. After forming the electrodes, the masking is removed, and subjected to a polarization treatment.

As explained above, the preparation method of the composite piezoelectric transducer of the present invention is compared with the preparation method of the conventional composite piezoelectric transducer. In the conventional composite piezoelectric transducer, the ceramic is integrated with the organic polymer before forming the electrodes, followed by subjected to a polarization treatment. On the contrary, the preparation method of the composite piezoelectric transducer of the present invention first forms the electrodes on the ceramic, which is then subjected to a polarization treatment, to form a piezoelectric ceramic having electrode groups, before the piezoelectric ceramic having electrode groups is integrated with the organic polymer, so as to produce a composite piezoelectric transducer.

Then, based on the differences, the feature of the preparation method of the composite piezoelectric transducer of the present invention is summarized as follows: The preparation method of the composite piezoelectric transducer of the present invention is featured in comprising: a first step for forming the groove on a piezoelectric ceramic having the electrode group by means of a mechanical process; and a second step for filling the organic polymer into the groove formed on the piezoelectric ceramic having the electrode group formed in the first step, followed by setting the organic polymer to be integrated with the piezoelectric ceramic having the electrode group, including bubbles therein.

The preparation method of the composite piezoelectric transducer of the present invention, as explained above, is processed in a same manner, on or before the polarization treatment, as the preparation method of the conventional piezoelectric ceramic transducer. Then, a composite treatment is applied, just by adding easy processes, such as formation of the grooves, and the filling, setting and removing of the organic polymer, and therefore, the composite piezoelectric transducer can be produced inexpensively.

The composite piezoelectric transducer of the present invention has an increased coefficient of the electromechanical coupling (kt) and a reduced acoustic impedance, so that it is preferably used in an ultrasonic cleaning equipment. In addition, it may be used in e.g. a medical device for breaking gallstones and kidney stones.

EXAMPLES

The present invention is hereinafter described in more detail based on the Examples of the present invention. However, the scope of the present invention should not be construed to be limited in the Examples.

Example 1

A powder for a PZT piezoelectric ceramic, a binder, a plastic material, a solvent, and a dispersion agent were mixed and kneaded together, which were then supplied to an extrusion molding machine, to form a green sheet having a predetermined thickness. The obtained green sheet was cut into a predetermined size, to obtain a formed product for the ceramic. The formed product for the ceramic, after degreased, was sintered at a temperature of 1200° C., to obtain a PZT ceramic. The ceramic was then processed by using a both sides grinder, to obtain a PZT ceramic having a length of 112 mm, a width of 30 mm, and a thickness of 1.05 mm. To the side surface of the width of 30 mm, an R-surface process was applied.

On the ceramic plate obtained, a silver paste was printed on one surface except a margin portion, and entirely on the other surface and the R-surface processed side surface by means of a screen method, and then baked at a temperature of 700° C. to form electrodes. Between the electrodes' ends of the PZT ceramic plate, a predetermined direct-current voltage was applied to carry out a polarization treatment, so as to obtain a piezoelectric ceramic having electrodes having a predetermined shape. Then, in order to produce a composite piezoelectric transducer having a structure shown in FIG. 1, a dicing saw having a blade with a width of 0.1 mm was used, and grooves were formed on a second surface of the piezoelectric ceramic (that is, a surface having an electrode entirely), toward the first surface having the margin portion, in the direction perpendicular to the R-surface processed side surface, to have a depth of 0.85 mm. (It is noted that the depth, 0.85 mm, was measured in the direction of the thickness of the piezoelectric ceramic.) During this process, the blade of the dicing saw was set to be transferred at a pitch such that a non-dice area of the piezoelectric ceramic had a width of 0.3 mm.

Into the grooves of the piezoelectric ceramic having the electrode group as formed above, a resin composition prepared by mixing an epoxy resin with a plastic micro balloon was filled, followed by being heated to set the epoxy resin and expand the plastic micro balloon, so as to form the organic polymer 2 including bubbles 2a as shown in FIG. 2. Thereafter, excess resin was removed to obtain a composite piezoelectric transducer. The plastic micro balloon was added at an amount of 6 parts by mass in 100 parts by mass of the epoxy resin.

Here, the composite piezoelectric transducer prepared by Example 1 is explained, regarding the relationship with the composite piezoelectric transducer as shown in FIG. 1. On the piezoelectric ceramic having the electrode group, the grooves were formed on a second surface of the piezoelectric ceramic (that is, one surface of the piezoelectric ceramic, noting that grooves were not formed on the surface having the margin portion). Into the grooves as formed above, an organic polymer including bubbles were filled. The state as seen from the second surface is shown in FIG. 1(Z). Namely, the electrode formed on the non-diced area of the piezoelectric ceramic, where there was no grooves formed, is referred to as symbol 3b.

On the contrary, a surface having the margin portion of the piezoelectric ceramic is shown in FIG. 1(Y), and the electrodes formed on the surface are the first electrode 3a and a part of the second electrode 3b, interposed by the margin portion 4.

As to the composite piezoelectric transducer as obtained above, a frequency and impedance property was measured by Gainphase Impedance Analyzer 4194A made by Hewlett-Packard Co., to obtain a resonant frequency (fr), antiresonant frequency (fa), resonant impedance (Zr), and antiresonant impedance (Za), in the direction of the thickness. The results are shown in Tale 1.

Using the resonant frequency (fr) and antiresonant frequency (fa), the coefficient of the electromechanical coupling (kt) in the direction of the thickness was calculated in accordance with the test method of a piezoelectric ceramic transducer by the Electronic Material Manufactures Association of Japan. Further from the resonant frequency (fr) and the bulk density of the composite piezoelectric transducer, an acoustic impedance was calculated. The results are shown in Tale 2. The bulk density of the composite piezoelectric transducer was obtained by measuring the geometric size of the obtained composite piezoelectric transducer using a micrometer and a vernier caliper, and measuring the mass by a precision balance.

Example 2

At the time of forming the grooves by using the dicing saw, the composite piezoelectric transducer was prepared in the same manner as Example 1, except the non-diced area having a width of 0.4 mm on the piezoelectric ceramic. The composite piezoelectric transducer as obtained in Example 2 was researched in the same manner as Example 1, to measure a resonant frequency (fr), antiresonant frequency (fa), resonant impedance (Zr), antiresonant impedance (Za), coefficient of electromechanical coupling (kt) in the direction of the thickness, and aco ustic impedance. The results are shown in Tables 1 and 2.

Example 3

At the time of forming the grooves by the dicing saw, the composite piezoelectric transducer was prepared in the same manner as Example 1, except the non-diced area having a width of 0.5 mm on the piezoelectric ceramic. The composite piezoelectric transducer as obtained in Example 2 was researched in the same manner as Example 1, to measure a resonant frequency (fr), antiresonant frequency (fa), resonant impedance (Zr), antiresonant impedance (Za), coefficient of electromechanical coupling (kt) in the direction of the thickness, and acoustic impedance. The results are shown in Tables 1 and 2.

Comparative Example 1

The piezoelectric ceramic having the electrode group as obtained in Example 1 was used as a piezoelectric ceramic transducer, without forming any grooves by the dicing machine (and therefore, not integrated with an organic polymer). The piezoelectric ceramic transducer as obtained in Comparative Example 1 was researched in the same manner as Example 1, to measure a resonant frequency (fr), antiresonant frequency (fa), resonant impedance (Zr), antiresonant impedance (Za), coefficient of electromechanical coupling (kt) in the direction of the thickness, and acoustic impedance. The results are shown in Tables 1 and 2.

Comparative Example 2

At the time of forming the grooves by using dicing saw, the composite piezoelectric transducer was prepared in the same manner as Example 1, except the non-diced area having a width of 0.7 mm on the piezoelectric ceramic. The composite piezoelectric transducer as obtained in Comparative Example 2 was researched in the same manner as Example 1, to measure a resonant frequency (fr), antiresonant frequency (fa), resonant impedance (Zr), antiresonant impedance (Za), coefficient of electromechanical coupling (kt) in the direction of the thickness, and acoustic impedance. The results are shown in Tables 1 and 2.

As explained above, the composite piezoelectric transducer of Examples 1 to 3, the piezoelectric ceramic transducer of Comparative Example 1, and the composite piezoelectric transducer of Comparative Example 2 were researched on a resonant frequency (fr), antiresonant frequency (fa), resonant impedance (Zr), antiresonant impedance (Za), coefficient of electromechanical coupling (kt) in the direction of the thickness and acoustic impedance, and the results are shown in Tables 1 and 2. Because of space limitations, the following symbols are listed in the Tables:

"fr"=resonant frequency, unit: kHz
"fa"=antiresonant frequency, unit: kHz
"Zr"=resonant impedance, unit: Ω
"Za"=antiresonant impedance, unit: Ω
"kt"=coefficient of electromechanical coupling, unit: %

It is noted that the acoustic impedance has a unit of "Mrayl," which is also abbreviated in Table 2. Table 1 also shows a ratio, between a width "w" of a non-diced area formed by forming the grooves on the piezoelectric ceramic and the depth "d" of the grooves, (that is, a ratio between the width "w" of the non-diced area and the depth "d" of the grooves, of the piezoelectric ceramic), which is shorten into "w/d." All of the composite piezoelectric transducers of Examples 1 to 3 and Comparative Example 2 have a depth of the groove as 0.85 mm, which corresponds to approximately 0.8 to the thickness, 1.05 mm, of the piezoelectric ceramic.

TABLE 1

|  | w/d | fr | fa | Zr | Za |
|---|---|---|---|---|---|
| Example 1 | 0.35 | 1389 | 1665 | 1.05 | 2950 |
| Example 2 | 0.47 | 1398 | 1660 | 1.16 | 3557 |
| Example 3 | 0.59 | 1412 | 1667 | 1.11 | 4340 |
| Comp. Example 1 | — | 1727 | 1927 | 0.05 | 409 |
| Comp. Example 2 | 0.82 | 1282 | 1470 | 0.67 | 3000 |

TABLE 2

|  | kt | Acoustic Impedance |
|---|---|---|
| Example 1 | 58.7 | 19.3 |
| Example 2 | 58.0 | 20.1 |
| Example 3 | 57.2 | 21.6 |
| Comp. Example 1 | 48.2 | 32.4 |
| Comp. Example 2 | 52.9 | 21.5 |

Apparent from the results shown in Table 2, the composite piezoelectric transducers of Examples 1 to 3 have an increased coefficient of the electromechanical coupling (kt) in the direction of the thickness, and a reduced acoustic impedance, compared with the piezoelectric ceramic transducer of Comparative Example 1. From the results, it is considered that the composite piezoelectric transducers of Examples 1 to 3 have a property that is high in propagation efficiency of the ultrasonic wave and thus excellent as a piezoelectric transducer used in an ultrasonic cleaning equipment, compared with the piezoelectric ceramic transducer of Comparative Example 1. It is also considered that the composite piezoelectric transducers of Examples 1 to 3 have an increased coefficient of the electromechanical coupling (kt), having an excellent property for using it as a piezoelectric transducer in an ultrasonic cleaning equipment, compared with the composite piezoelectric transducer of Comparative Example 2.

Figure 8:
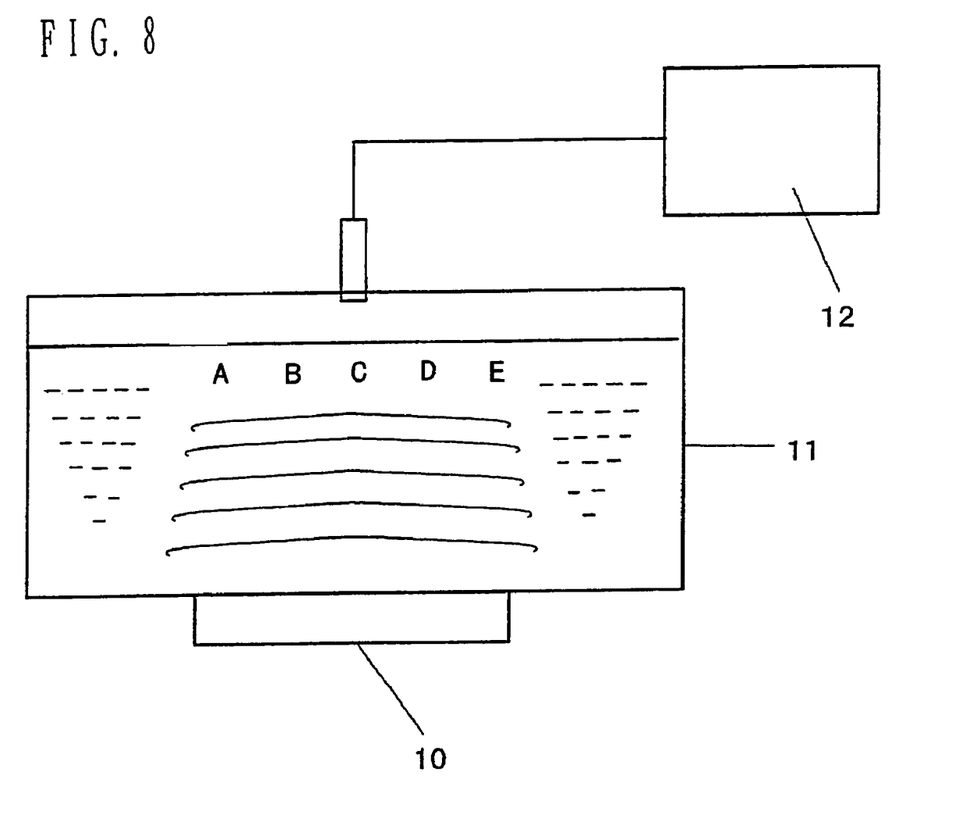
FIG. 8 shows a view illustrating a test apparatus for researching the difference in strength of the sound pressure, depending on the portions in a cleaning bath of an ultrasonic cleaning equipment provided with a composite piezoelectric transducer.

Next, each of the composite piezoelectric transducer of Example 1 and the piezoelectric ceramic transducer of Comparative Example 1 was attached to a cleaning bath of an ultrasonic cleaning equipment, using a solvent of water. The difference of the sound pressure strength was researched as to the dependence of the positions in the cleaning bath. The results are described hereinafter. The test for researching the difference was carried out, by, as shown in FIG. 8, attaching the composite piezoelectric transducer 10 of Example 1 to the bottom of the cleaning bath 11, using a solvent of water, and an ultrasonic wave was generated from the composite piezoelectric transducer 10, which was detected by the detector 12 at the five portions, A, B, C, D and E. The sound pressure at the portion C is defined as a standard value, 1 (note: the portion, C, is the center of the composite piezoelectric transducer), and a ratio of the sound pressure at the portions of A, B, D and E was obtained. The results are shown in Tale 3.

Also, the piezoelectric ceramic transducer of Comparative Example 1 was attached to the bottom of the cleaning bath of an ultrasonic cleaning equipment, in the same manner as the composite piezoelectric transducer of Example 1. Then, an ultrasonic wave was generated from the piezoelectric ceramic transducer, which was then detected by the detector at the five portions, A, B, C, D and E. The sound pressure at the portion C is defined as a standard value, 1, and a ratio of the sound pressure at the portions of A, B, D and E was obtained. The results are shown in Table 3. It is noted that either the composite piezoelectric transducer of Example 1 or the piezoelectric ceramic transducer of Comparative Example 1 utilizes an antiresonant frequency to generate the ultrasonic wave, setting an input voltage to an area of the piezoelectric ceramic as $2W/cm^2$.

TABLE 3

|  | Ratio of Sound Pressure | | | | |
|---|---|---|---|---|---|
|  | A | B | C | D | E |
| Example 1 | 0.8 | 0.9 | 1.0 | 0.9 | 0.8 |
| Comp. Ex. 1 | 0.3 | 0.6 | 1.0 | 0.6 | 0.2 |

Apparent from the results shown in Table 3, the composite piezoelectric transducer of Example 1 did not show a significant difference in the sound pressure, depending on the portion, which means that a less unevenness of the sound pressure was given. On the contrary, the piezoelectric ceramic transducer of Comparative Example 1 showed that the sound pressure was significantly reduced as the portion got away from the center, meaning that a large unevenness of the sound pressure was given.

INDUSTRIAL APPLICABILITY

As explained above, the composite piezoelectric transducer of the present invention has a high coefficient of the electromechanical coupling (kt) in the direction of the thickness, and a reduced acoustic impedance. Thus, the composite piezoelectric transducer of the present invention is expected to strength a sound pressure and to reduce unevenness in cleaning, when it is adapted in an ultrasonic cleaning equipment.

The composite piezoelectric transducer of the present invention is also prepared inexpensively because it can be prepared by forming grooves on a conventional piezoelectric ceramic transducer, into which an organic polymer is filled and set, to give a composite piezoelectric transducer having a high performance. Further, since composite piezoelectric transducer of the present invention has the electrode group comprising the specific first and second electrodes, so that positive and negative electrodes can be taken either from a single surface or from a surface and a side surface, of the composite piezoelectric transducer. Thus, the composite piezoelectric transducer of the present invention can be adapted in the same manner as the conventional piezoelectric ceramic transducer for an ultrasonic cleaning equipment, not resulting in restricting the workability at the time of attaching it to an ultrasonic cleaning equipment.

What is claimed is:

1. A composite piezoelectric transducer, comprising:
   a piezoelectric ceramic having a first surface, a second surface opposite to the first surface, a side surface extended between the first and second surfaces, and a thickness,
   a groove formed on the second surface to extend in the direction perpendicular to the side surface, the groove having a depth;
   a non-diced area formed by forming the groove, the non-diced area having a width;
   an organic polymer filled in the groove, the organic polymer including bubbles;
   a first electrode formed on the first surface; and
   a second electrode formed on the second surface, which is extended to the first surface through the side surface, or which is extended to the side surface;
   a margin insulating the first electrode from the second electrode;
   wherein the first and the second electrodes are formed only on the piezoelectric ceramic, wherein the groove has a depth 50% to 90% of the thickness of the piezoelectric ceramic, and wherein a ratio w/d between the width and the depth is 0.2 to 0.7.

2. A composite piezoelectric transducer according to claim 1, wherein the groove has a depth 70% to 90% of the thickness of the piezoelectric ceramic.

3. A method for preparing a composite piezoelectric transducer according to claim 1, comprising:
   forming the groove on the piezoelectric ceramic having the electrodes by means of a mechanical process;
   filling the organic polymer into the groove formed on the piezoelectric ceramic;
   setting the organic polymer to be integrated with the piezoelectric ceramic, to form the bubbles included in the set organic polymer.

* * * * *